United States Patent [19]

Schlögl et al.

[11] Patent Number: 4,687,726

[45] Date of Patent: Aug. 18, 1987

[54] PHOTOSENSITIVE RECORDING MATERIAL FOR USE IN THE PRODUCTION OF NEGATIVE-WORKING PLANOGRAPHIC PRINTING PLATES WITH DIAZONIUM POLYCONDENSATE AND INORGANIC PIGMENT

[75] Inventors: Gunter Schlögl, Kelkheim; Gerhard Mack, Wiesbaden, both of Fed. Rep. of Germany; Manfred Michel, Suzano, Brazil

[73] Assignee: Hoechst Aktiengesellschaft, Frankfurt am Main, Fed. Rep. of Germany

[21] Appl. No.: 731,778

[22] Filed: May 8, 1985

[30] Foreign Application Priority Data

May 12, 1984 [DE] Fed. Rep. of Germany ....... 3417645

[51] Int. Cl.$^4$ .......................... G03C 1/60; G03C 1/76
[52] U.S. Cl. ................................... 430/175; 430/157; 430/176; 430/292; 430/300; 430/302; 430/945; 430/950
[58] Field of Search ............... 430/175, 157, 176, 950, 430/28, 144

[56] References Cited

U.S. PATENT DOCUMENTS

| | | | |
|---|---|---|---|
| 2,746,863 | 5/1956 | Kosalek et al. | 430/176 |
| 2,822,272 | 2/1958 | Kosalek et al. | 430/176 |
| 2,871,119 | 1/1959 | Weegar et al. | 430/175 |
| 3,396,019 | 8/1968 | Uhlig | 430/175 |
| 3,679,419 | 7/1972 | Gillich | 430/175 |
| 3,890,152 | 6/1975 | Ruckert et al. | 430/175 |
| 3,891,443 | 6/1975 | Halpern et al. | 96/79 |
| 4,126,460 | 11/1978 | Okishi | 96/35.1 |
| 4,168,979 | 9/1979 | Okishi et al. | 96/75 |

FOREIGN PATENT DOCUMENTS

| | | | |
|---|---|---|---|
| 1148014 | 6/1983 | Canada . | |
| 1313777 | 4/1973 | United Kingdom | 430/175 |

*Primary Examiner*—Charles L. Bowers
*Attorney, Agent, or Firm*—Schwartz, Jeffery, Schwaab, Mack, Blumenthal & Evans

[57] ABSTRACT

Disclosed are a novel photosensitive recording material and a method for using the recording material in the production of planographic printing plates. The recording material comprises a support and a negative-working photosensitive layer that contains a diazonium salt polycondensation product as the photosensitive compound and, in addition, a colorless inorganic pigment which is insoluble in water and organic solvents and which has an average particle diameter from 1 to 20 $\mu$m. The pigment is present in a quantity from 0.01 to 2% by weight, relative to the non-volatile constituents of the layer, and is evenly distributed in the layer. Due to the pigment content, a rough layer surface is formed, which has the effect of reducing the time required for creating a vacuum in a vacuum frame into which the recording material is mounted. The presence of the pigment in the layer also produces an improved tonal rendering in the print obtained.

10 Claims, No Drawings

PHOTOSENSITIVE RECORDING MATERIAL FOR USE IN THE PRODUCTION OF NEGATIVE-WORKING PLANOGRAPHIC PRINTING PLATES WITH DIAZONIUM POLYCONDENSATE AND INORGANIC PIGMENT

BACKGROUND OF THE INVENTION

The present invention relates to a photosensitive recording material comprising a support and a negative-working photosensitive layer which has a rough surface and which contains a diazonium salt polycondensation product as the photosensitive compound.

Presensitized printing plates, the surfaces of which have a particular degree of roughness, are known in the art. These plates offer the advantage of considerably reducing the vacuum contact time, i.e., the time which is required to evacuate the vacuum frame, until an entirely uniform contact between the original and the printing plate is obtained. With these plates it is also possible to prevent the formation of air pockets between the original and the printing plate.

In most cases, a rough surface is produced by coating the photosensitive layer with an additional layer which is roughened or rendered matt, respectively, by adding pigment particles, by embossing with the aid of a correspondingly roughened surface, for example, with an embossing roll, or by any other suitable means. In the subsequent developing process, the matted covering layer is dissolved in the developer. Materials of this kind are described in German Offenlegungsschriften No. 25 12 043 and No. 26 38 710. It is a disadvantage of these plates that they must be coated in two steps and that the entire substance of the covering layer, including any pigment particles which may be present, collects in the developer, which is thus rendered useless more rapidly.

In German Offenlegungsschrift No. 29 26 236, similar recording materials with rough surfaces are described, in which the photosensitive layer contains particles having a diameter which is greater than the thickness of the layer. If the difference between particle diameter and layer thickness is in a particular range, a corresponding distance between the surface of the layer and the original used for copying is obtained. Since the exposure lamps which are customarily used never emit ideally parallel light, slightly unsharp reproduction in the layer is to be expected in this case, i.e., scattered light passes into boundry areas of the photosensitive layer that would otherwise be covered by an original which would be in close contact with the layer. Depending on the size, index of refraction, and quantity of the particles contained in the layer, similar scattering, refraction, or even diffraction phenomena may also be caused by the particles themselves.

All these effects can result in a reduction of the (unexposed) screen dots which remain on the support in the development of positive-working photosensitive layers. Although these exposure effects are not clearly understood, it has been found that, in the exposure and development of a photosensitive material according to German Offenlegungsschrift No. 29 26 236, demonstrable differences actually occur in the surface coverage of the developed printing plate, depending on whether the photosensitive layer does or does not contain pigment particles.

In the table below, the percentage surface coverage, i.e., the percentage of a surface covered by image elements, is compared for (1) an original film, (2) a printing plate containing particles in the photosensitive layer, which has been exposed under the original film and then developed, and (3) a printing plate without particles in the layer, which has been processed in the same way.

TABLE 1

| Film | Surface Coverage in % | | | | | | | | | | | |
|---|---|---|---|---|---|---|---|---|---|---|---|---|
| | 95 | 89 | 81 | 72 | 63 | 54 | 47 | 38 | 29 | 20 | 12 | 5 |
| Positive layer with particles | 99 | 97 | 92 | 86 | 80 | 71 | 62 | 53 | 43 | 31 | 21 | 10 |
| Positive layer without particles | 99 | 98 | 94 | 89 | 83 | 74 | 66 | 57 | 47 | 34 | 23 | 11 |

As the data in Table 1 show, the layer containing pigment particles has a surface coverage, i.e., a visually appearing optical density, which is noticeably closer to the density of the original than that of the corresponding layer without particles; in practice, the tonal rendering of the layer which contains particles is referred to as being "lighter" (showing reduced screen dots). This result is desired and can be regarded as an additional advantage of the positive-working materials according to German Offenlegungsschrift No. 29 26 236.

Based on this knowledge, it was to be expected that an opposite effect would necessarily occur in the case of negative (reverse-working) layers, i.e., tonal rendering of the copy was expected to increase. Since negative layers also yield prints in which tonal rendering is invariably denser than in the original from which the negative master has been produced, one actually had to be prepared for a deterioration in the quality of the print obtained from a negative-working printing plate of the above-described kind.

In fact, a comparison between (1) a known negative-working printing plate in which a covering layer containing particles that produce a roughening effect is applied on top of the photosensitive layer and (2) an otherwise identical plate which lacks pigment particles shows that the printing plate obtained from the pigment-containing plate prints "heavier" (with larger screen dots). In other words, plate (1) yields a print having a higher surface coverage than a print obtained from the printing plate (2) which omits the particles.

Moreover, it was expected that, in a negative plate having a photosensitive layer containing pigment particles of a diameter exceeding the layer thickness, the layer areas underneath a particle would not be hardened or would at least be incompletely hardened upon exposure, because the particles absorb, reflect, or scatter the light. Since in a particle-containing layer the particles remain in the printing image areas of the layer, it was also expected that the particles would not be anchored firmly enough and would consequently break out after printing a relatively small number of copies, thus rendering the printing plate useless.

It is probably for these reasons that, to date, only those printing plates roughened by particles have been accepted in practice that either work positively or contain the particles in a covering layer which is applied on top of the photosensitive layer and which is removed together with the particles in the developing process. The few publications which describe negative-working layers containing pigment particles generally relate to printing plates which do not require a high resolution, for example, photopolymerizable relief printing plates, as described in German Offenlegungsschrift No. 24 03 487.

SUMMARY OF THE INVENTION

It is therefore an object of the present invention to provide a negative-working photosensitive recording material, suitable for use in the production of high-resolution planographic printing plates, which contains particles in its photosensitive layer.

It is also an object of the present invention to provide a method for producing a planographic printing surface which requires less time to effect complete contact with an original in a vacuum frame, but which displays resolution, tonal rendering and print-run values that are at least as good as are obtained for corresponding materials that do not contain the above-mentioned pigment particles.

In accomplishing the foregoing objects, there has been provided, in accordance with one aspect of the present invention, a photosensitive recording material for use in the production of planographic printing plates, comprising a support and a negative-working photosensitive layer which contains a diazonium salt polycondensation product and which has a rough surface, the photosensitive layer comprising, evenly distributed therein, a colorless inorganic pigment which (a) is insoluble in water and organic solvents and (b) has an average particle diameter from 1 to 20 μm, said inorganic pigment being present in said photosensitive layer in a quantity ranging from about 0.01 to 2% by weight, relative to the weight of the non-volatile constituents of the photosensitive layer. In a preferred embodiment, the aforesaid photosensitive layer has a thickness of from about 0.1 to 5 μm.

In accordance with another aspect of the present invention, there has been provided a method for producing a high-resolution planographic printing surface, wherein the above-described photosensitive recording material is imagewise exposed to light and treated with a developer so that unexposed areas of the photosensitive layer are removed from the support, producing the high-resolution planographic printing surface.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS

Surprisingly, the above-described disadvantages do not occur in printing plates obtained from the material according to the present invention. In many cases, tonal rendering upon printing is even "lighter" than in corresponding pigment-free plates. Moreover, the print run is, in most cases, increased by the addition of pigment. The advantages of the material of the present invention are particularly achieved if the photosensitive layer contains a polymeric binder, in addition to the diazonium salt polycondensation product.

The surface of the photosensitive layer has a roughness which is substantially determined by the pigment contained in the layer. The average particle size of the pigment should always be greater than the layer thickness. Preferably, the average particle diameter exceeds the thickness of the layer by 1 to 15 μm.

The layer thickness of the photosensitive layer depends on the purpose for which the material is used and corresponds to customary values. In the preferred use of the material for the production of planographic printing plates, the layer thickness generally ranges between 0.1 and 5 μm, preferably between 1 and 4 μm.

The average particle size of the particles embedded in the photosensitive layer preferably ranges between 3 and 10 μm. The amount of particles contained in the layer preferably ranges between 0.1 and 1.0% by weight, relative to the total content of non-volatile constituents in the layer.

For the particles embedded in the photosensitive layer, in accordance with the present invention, substances can be used that are compatible with the layer constituents, that do not adversely influence coating of the support, and that can be removed, together with the unexposed areas of the photosensitive layer, using a developer with which the substances comprising the particles do not react during the developing process. Examples of suitable particles include particles of silica or silicon dioxide, which may have been specially pretreated, and particles of aluminum oxide, zinc oxide, aluminum silicate, aluminum hydroxide, or titanium dioxide. In each case, the particles can comprise a single substance or particles of different substances can be combined.

In the preparation of the photosensitive layers, the particles are added directly to the coating solution, while stirring well. If appropriate, the particles can be introduced into a ball mill and dispersed in a suitable solvent, together with part of the binder used for the recording layer. The resulting dispersion is then added to the remainder of the prepared coating solution, while stirring well.

Suitable diazonium salt polycondensation products are condensation products of condensible aromatic diazonium salts, for example, of diphenylamine-4-diazonium salts, with aldehydes, preferably with formaldehyde. It is particularly advantageous to use cocondensation products containing, in addition to the diazonium salts units, other non-photosensitive units which are derived from condensible compounds, particularly from aromatic amines, phenols, phenol ethers, aromatic thioethers, aromatic hydrocarbons, aromatic heterocyclic compounds and organic acid amides. These condensation products are described in German Offenlegungsschrift No. 20 24 244. Generally, all diazonium salt polycondensation products described in German Offenlegungsschrift No. 27 39 774 are suitable.

The diazonium salt units $A-N_2X$ are preferably derived from compounds corresponding to the formula $(R^1-R^2-)_pR^3-N_2X$, in which:

X is the anion of the diazonium compound,
p is an integer from 1 to 3,
$R^1$ is an aromatic radical which is capable of condensation, in at least one position, with an active carbonyl compound,
$R^3$ is a phenylene group, and
$R^2$ is a single bond or one selected from the group consisting of:
—$(CH_2)_q$—$NR^4$—,
—O—$(CH_2)_r$—$NR^4$—,
—S—$(CH_2)_r$—$NR^4$—,
—S—$CH_2CO$—$NR^4$—,
—O—$R^5$—O—, —O—,
—S—, and —CO—NR⁴—,
wherein:
q is an integer from 0 to 5,
r is an integer from 2 to 5,
$R^4$ is a hydrogen atom, an alkyl group having from 1 to 5 carbon atoms, an aralkyl group having from 7 to 12 carbon atoms or an aryl group having from 6 to 12 carbon atoms, and
$R^5$ is an arylene group having from 6 to 12 carbon atoms.

As mentioned above, the preferred recording materials according to the present invention contain a polymeric binder. In that case, the photosensitive layer generally comprises from 5 to 90% by weight, preferably from 10 to 70% by weight, of diazonium compound and from 95 to 10% by weight, preferably from 90 to 30% by weight, of polymeric binder, based on the total amount of non-volatile layer constituents.

Water-insoluble polymers which are soluble in organic solvents are preferably used as binders. Examples of such polymers are polyvinyl acetate, polyvinyl acetals, polyurthanes, epoxy resins and polymers of acrylic or methacrylic acid esters. It is particularly advantageous to use binders which are soluble in dilute aqueous-alkaline solutions, since with these binders development can be effected by means of purely aqueous solutions, without the addition of organic solvents. Binders of this kind include, for example, phenolic resins, polyvinyl phenols, copolymers of acrylic or methacrylic acid with esters of these acids, copolymers of styrene and maleic anhydride polymers with sulfonylurethane side groups, and products from reacting dicarboxylic acid anhydrides with hydroxyl group-containing polymers.

The last-mentioned reaction products are particularly preferred. Suitable dicarboxylic acid anhydrides include, in particular, maleic anhydride, phthalic anhydride, succinic anhydride, and 3-oxa-glutaric anhydride. The preferred hydroxyl-group containing polymers include polymers with vinyl alcohol units, and also partial ethers or partial esters of cellulose, epoxy resins and saponified epoxy resins, copolymers of allyl alcohol or of higher molecular weight unsaturated alcohols, polyhydroxyalkylacrylates and polyhydroxyalkylmethacrylates. Particularly advantageous are polymers having vinyl alcohol units, such as partially saponified polyvinyl esters, polyvinyl acetals having free hydroxyl groups, and corresponding reaction products of copolymers having vinyl ester units, vinyl acetal units, or vinyl alcohol units.

The molecular weights of these reaction products in general range between 5,000 and 200,000, preferably between 10,000 and 100,000. The acid number generally ranges from 5 to 80, preferably from 10 to 70. These carboxyl-group containing reaction products are described in U.S. patent application Ser. No. 697,925, filed Feb. 4, 1985.

To stabilize the photosensitive layer, it is advantageous to add a compound having an acid character. Compounds which can be used include mineral acids and strong organic acids, with phosphoric acid, sulfuric acid, perchloric acid, boric acid or p-toluene sulfonic acid being preferred. Phosphoric acid is a particularly suitable acid.

Plasticizers, adhesion promoters, dyes, pigments and color precursors can also be added to the layers.

The types and quantities of such additions depend upon the field of application for which the photosensitive recording material is intended. In principle, care must be taken that the added substances do not absorb an excessive portion of the actinic light which is required for cross-linking, because this would result in a reduction of the practical sensitivity to light.

In addition, the photosensitive layers can contain dyes and/or pigments which serve to enhance the contrast upon exposure and also to harden the layer. Suitable dyes are, for example, specified in U.S. Pat. Nos. 3,218,167 and 3,884,693. Particularly suitable are, for example, Victoria Pure Blue FGA (Color Index Basic Blue 81), Renol Blue B2G-H (Color Index 74,160), Crystal Violet or Rhodamine 6 GDN (Color Index 45,160). To enhance image contrast after exposure, Metanil Yellow (Color Index 13,065), Methyl Orange (Color Index 13,025) or Phenylazodiphenylamine can be used.

Within the scope of the present invention, the following weight proportions of the most important additions contained in the photosensitive composition are preferred:
Binder: 30 to 90%;
Diazonium salt polycondensation product: 10 to 70%;
Pigment particles: 0.01 to 2%;
Acid: 0 to 10%;
Dye: 0 to 12%;
Dye which changes its color upon exposure: 0 to 5%.

The support material is coated from appropriate organic solvents or solvent mixtures, generally by flowcoating, spraying or dipping. Suitable solvents include alcohols, ketones, esters, ethers, and the like. The partial ethers of glycols or of ketoalcohols, such as ethylene glycol monomethyl ether, have proved to be favorable solvents.

The photosensitive recording materials of the present invention are preferably used for the production of planographic printing plates, which preferably comprise aluminum as the support material. It is particularly preferred to pretreat the aluminum used for this purpose in a conventional manner, for example, by a mechanical, chemical or electrochemical roughening process which is, optionally, followed by an anodic oxidation. A further treatment of this support material, for example, with polyvinyl phosphonic acid, alkali metal silicate, phosphate, hexafluorozirconate, chromate, borate, polyacrylamide and cellulose derivatives, is advantageous.

The recording materials of the present invention are processed in a conventional manner, by imagewise exposing the photosensitive layer and then washing-out the unexposed areas of the layer with a suitable developer. More specifically, the recording material is exposed under an original, as is known in the art, using light sources which emit light with the highest possible spectral fraction in the near ultraviolet region. Exposure can also be effected by laser irradiation. Suitable lasers for irradiation are shorter-wave lasers of an appropriate power, for example, argon lasers, krypton ion lasers and helium/cadmium lasers, emitting in the region between about 300 and 600 nm.

Development is carried out using aqueous solutions or organic solvents, depending on the nature of the layer constituents. Aqueous solutions are generally preferred.

To develop the particularly preferred layers containing alkali-soluble binders, aqueous-alkaline solutions are used, which have a pH value in the range from about 8 to 14, preferably from about 9 to 12, and which contain buffer salts, such as water-soluble alkali metal phosphates, silicates, borates, carbonates, acetates and benzoates. Additional constituents which can be used are wetting agents, preferably anionic wetting agents and, if appropriate, water-soluble polymers. The solution can also contain minor amounts, for example, up to 5% by weight, preferably not more than 2% by weight, of water-miscible organic solvents. It is preferred to use solvents which are only slightly volatile, for example, araliphatic alcohols, the vapor pressure of which is of no consequence in the handling of the developer.

Development can be performed in the conventional manner by dipping, spraying, brushing or wiping over with a pad.

Using the printing plate so produced, it is possible to produce very large print runs.

With the aid of the pigment-containing photosensitive layer prepared according to the present invention and applied to a suitable support, a recording material having a rough or uneven layer surface is obtained, which makes it possible to place a diapositive in intimate contact with the photosensitive layer, the time required for evacuating the vacuum frame being considerably reduced in the process. This advantage is achieved without giving rise to halations due to air pockets remaining between the layer surface and the original.

It is much easier to produce the material of the present invention than negative-working materials which have hitherto been employed for the same purpose. Only a single coating step, carried out under customary conditions, is required, and the resulting layer surface does not need any subsequent processing, such as embossing.

Compared with photosensitive layers provided with an uneven non-photosensitive covering layer containing matting agents, or compared with printing plates wherein the photosensitive layer is additionally provided with an uneven regular pattern, the printing plates produced according to the present invention possess a greater exposure latitude.

In the examples which follow, the invention is explained in detail. Parts by weight and parts by volume are related as $g/cm^3$. Percentages and quantitative proportions refer to units by weight, unless otherwise indicated.

EXAMPLE 1

1.7 parts by weight of the product obtained by reacting a polyvinyl butyral, having a molecular weight in the range form 70,000 to 80,000 and containing 71% by weight of vinyl butyral units, 2% by weight of vinyl acetate units, and 27% by weight of vinyl alcohol units, with propenyl sulfonyl isocyanate, 0.6 part by weight of a diazonium salt polycondensation product obtained from 1 mole of 3-methoxydiphenylamine-4-diazonium sulfate and 1 mole of 4,4'-bis-methoxymethyl-diphenylether and precipitated as the mesitylene sulfonate, 0.09 part by weight of Victoria Pure Blue FGA (Color Index Basic Blue 81), and 0.07 part by weight of phosphoric acid (85% strength) were dissolved in 60 parts by weight of 2-methoxyethanol and 20 parts by weight of butylacetate, and then were admixed with 0.015 part by weight of finely divided silica having an average particle diameter of 8 μm.

This solution was treated in an ultrasonic bath (48 kHz) for 5 minutes, in order to disperse agglomerates.

An aluminum sheet which had been electrolytically roughened, anodically oxidized, and treated with polyvinyl phosphonic acid was coated with this solution with the aid of a whirler, such that a layer weight of 1.0 $g/m^2$ was obtained.

Another plate was prepared in the same manner, but without an addition of silica.

Both plates were imagewise exposed under a transparent film original showing screen areas with differing percentages of surface coverage, and were then developed with the following solution:

5 parts by weight of sodium lauryl sulfate,
1.5 parts by weight of sodium metasilicate $\times 5H_2O$,
1 part by weight of trisodium phosphate $\times 12H_2O$, and
92.5 parts by weight of water.

While the printing plate containing silica could be brought into complete contact with the film original in the vacuum frame after a vacuum time of only 20 seconds, and without irregular halation effects occurring upon exposure, the reference plate required a vacuum time of 1 to 2 minutes to effect intimate contact with the film original.

On the two copying layers having identical photosensitivities, screen areas were generated by exposures of equal duration.

After developing, the two printing plates were mounted in an offset-printing machine and used for printing side by side. Color intensity was adjusted on the printing machine, in such a way that the same solid density was measured over the entire width of the two images on the printed sheet. The percentage of surface coverage (F) was measured by means of a densitometer. The table below indicates the percentages of surface coverage on the original film and on a print obtained from each of the above-described printing plates respectively. Since a negative original was used, the percentages measured on the original were subtracted from 100, so that comparable density values resulted for original and copy.

TABLE 2

| Film | Surface Coverage in % | | | | | | | | | | | |
|---|---|---|---|---|---|---|---|---|---|---|---|---|
| (100-F) | 5 | 11 | 19 | 28 | 37 | 46 | 53 | 62 | 71 | 80 | 88 | 95 |
| Layer containing particles (F) | 18 | 29 | 42 | 54 | 64 | 74 | 79 | 84 | 89 | 94 | 97 | 100 |
| Layer without particles (F) | 18 | 31 | 43 | 56 | 66 | 76 | 80 | 85 | 90 | 94 | 98 | 99 |

EXAMPLE 2

1.2 parts by weight of the reaction product of the polyvinyl butyral mentioned in Example 1 with maleic anhydride (acid number: 30), 1.2 parts by weight of a diazonium salt polycondensation product of 3-methoxy-diphenylamine-4-diazonium sulfate and formaldehyde, 0.02 part by weight of phenylazodiphenylamine, and 0.3 part by weight of Renol Blue B2G-H (Color Index 74,160)

were dissolved in 97.3 parts by weight of 2-methoxyethanol and then admixed with 0.015 part by weight of finely divided silica having an average particle diameter of 8 μm.

This solution was treated in an ultrasonic bath (48 kHz) for 5 minutes, in order to disperse agglomerates.

An aluminum sheet which had been electrolytically roughened, anodically oxidized, and treated with polyvinyl phosphonic acid was coated with the above-described solution with the aid of a whirler, such that a layer weight of 1.0 g/m² was obtained.

For comparison, a plate was prepared which did not contain particles, but which was otherwise identical to the first plate.

Both plates were imagewise exposed under a transparent film original showing screen areas with graded percentages of surface coverage, and were then developed using the solution specified in Example 1.

While the printing plate produced with an addition of particles could be placed in complete contact with the film original in the vacuum frame after a vacuum time of only 20 seconds, without irregular halation effects occurring upon exposure, the reference plate without pigment addition required a vacuum time of 1 to 2 minutes to produce an intimate contact with the film original.

On these two copying layers of identical photosensitivities, screen areas were generated by exposures of equal duration.

After developing, the two printing plates were mounted in an offset-printing machine and used for printing side by side. Color intensity was adjusted on the printing machine in such a way that the same solid density was measured over the two images on the printed sheet. The percentage of surface coverage was measured by means of a densitometer. The table below indicates the percentages of surface coverage on the original film and on a print obtained from each of the two printing plates described above.

TABLE 3

| Film (100-F) | Surface Coverage in % | | | | | | | | | | | |
|---|---|---|---|---|---|---|---|---|---|---|---|---|
| | 5 | 11 | 19 | 28 | 37 | 46 | 53 | 62 | 71 | 80 | 88 | 95 |
| Layer containing particles (F) | 16 | 26 | 38 | 50 | 60 | 71 | 76 | 83 | 87 | 93 | 97 | 99 |
| Layer without particles (F) | 16 | 27 | 39 | 51 | 61 | 71 | 77 | 84 | 89 | 94 | 98 | 100 |

EXAMPLE 3

In a solution composed of:
2.1 parts by weight of polyvinyl formal having an average molecular weight of 30,000 and containing about 7% of vinyl alcohol units, 30% of vinyl acetate units, and 50% of vinyl formal units,
0.6 part by weight of the diazonium salt polycondensation product indicated in Example 1,
0.06 part by weight of an 85% strength phosphoric acid, and
0.3 part by weight of copper phthalocyanine in
96.9 parts by weight of 2-methoxyethanol
0.015 part by weight of silica as indicated in Example 1
were dispersed as described in that example.

The resulting coating solution was spin-coated on an aluminum sheet pre-treated as specified in Example 1 and then dried. The weight of the resulting layer was 1 g/m². Another plate was prepared in the same manner, but without an addition of silica.

The two plates were exposed under an original, as described in Example 1, and developed with a solution composed of:
1 part by weight of 2-n-butoxyethanol,
21 parts by weight of n-propanol, and
78 parts by weight of water.

Both printing plates were used for printing side by side in an offset-printing machine, as in Example 1. The following table indicates the percent surface coverages of the original film and of a print obtained from each of the printing plates.

TABLE 4

| Original (100-F) | Surface Coverage in % | | | | | | | | | | | |
|---|---|---|---|---|---|---|---|---|---|---|---|---|
| | 5 | 11 | 19 | 28 | 37 | 46 | 53 | 62 | 71 | 80 | 88 | 95 |
| with SiO₂ (F) | 15 | 25 | 36 | 49 | 59 | 71 | 76 | 82 | 87 | 93 | 97 | 100 |
| without SiO₂ (F) | 15 | 25 | 37 | 48 | 59 | 72 | 77 | 82 | 88 | 94 | 98 | 100 |

EXAMPLE 4 (COMPARATIVE EXAMPLE)

A presensitized printing plate was prepared as described for the reference plate in Example 1, i.e., without silica pigment in the photosensitive layer.

A solution composed of:
2.8 parts by weight of polyvinyl alcohol and
0.06 part by weight of a non-ionic surfactant in
97.12 parts by weight of water
was admixed with 0.021 part by weight of the finely divided silica specified in Example 1. The resulting dispersion was subjected to an ultrasonic treatment for 5 minutes.

A portion of the above-described printing plate was coated with the resulting dispersion and then was dried. Another portion of the printing plate was coated with the polyvinyl alcohol solution lacking silica, and was also dried. In both cases, the covering layer had a layer weight of 1 g/m².

As described in Example 1, the two printing plates were exposed under a halftone stepwedge, developed and mounted side by side in a printing machine.

The following table indicates the percentages of surface coverage of the original and the two printed sheets printed from the two printing plates described above.

TABLE 5

| Film (100-F) | Surface Coverage in % | | | | | | | | | | | |
|---|---|---|---|---|---|---|---|---|---|---|---|---|
| | 5 | 11 | 19 | 28 | 37 | 46 | 53 | 62 | 71 | 80 | 88 | 95 |
| Covering Layer with SiO₂ (F) | 14 | 25 | 38 | 51 | 61 | 71 | 76 | 83 | 88 | 93 | 98 | 100 |
| Covering Layer without SiO₂ (F) | 13 | 25 | 37 | 49 | 59 | 69 | 74 | 80 | 86 | 92 | 96 | 100 |

Table 5 shows that, when the printing plate was coated with a pigmented covering layer as described in the prior art, the surface coverage upon printing was higher with an addition of silica than without silica addition.

What is claimed is:

1. A photosensitive recording material for use in the production of planographic printing plates, comprising a support and a negative-working photosensitive layer which is provided on said support, which has a thickness ranging from about 0.1 to 5 μm, and which has a rough surface, said photosensitive layer consisting essentially of (a) an amount of diazonium salt polycondensation product sufficient to impart photosensitivity to said photosensitive layer and, evenly distributed in said photosensitive layer, (b) a colorless inorganic pigment which is insoluble in water and organic solvents and which has an average particle diameter from 1 to 20 μm, said inorganic pigment (i) being present in said photosensitive layer in a quantity ranging from about 0.01 to 2.0% by weight, relative to the weight of the non-volatile constituents of said photosensitive layer, and (ii) having an average diameter which exceeds the thickness of said photosensitive layer by about 1 to 15 μm, wherein said recording material, after exposing of said photosensitive layer through a halftone master image and developing, provides a copy image comprised of halftone dots that are closer in size to the master dots than those comprising a copy image provided by a recording material which comprises a negative-working photosensitive layer lacking said inorganic pigments.

2. A photosensitive recording material as claimed in claim 1, wherein the inorganic pigment comprises at least one from the group consisting of silica, aluminum oxide, aluminum silicate, aluminum hydroxide, titanium dioxide and zinc oxide.

3. A photosensitive recording material as claimed in claim 1, wherein the photosensitive layer further comprises a polymeric binder.

4. A photosensitive recording material as claimed in claim 3, wherein said polymeric binder is insoluble in water and soluble in dilute aqueous-alkaline solutions.

5. A photosensitive recording material as claimed in claim 4, wherein said polymeric binder comprises a product obtained by reacting an intramolecular anhydride of an organic polycarboxylic acid with a hydroxyl group-containing polymer which does not contain any further functional groups capable of reaction with acid anhydrides.

6. A photosensitive recording material as claimed in claim 1, wherein said diazonium salt polycondensation product comprises recurrent units $A\text{-}N_2X$ and B which are linked by an intermediate group derived from a carbonyl compound which is capable of condensation, wherein A denotes a radical of an aromatic diazonium compound which is capable of condensation with formaldehyde and B denotes a radical of a second compound which is free from diazonium groups and is capable of condensation with formaldehyde, said second compound being selected from the group consisting of an aromatic amine, a phenol, a phenol ether, an aromatic thioether, an aromatic hydrocarbon, an aromatic heterocyclic compound and an organic acid amide.

7. A photosensitive recording material as claimed in claim 6, wherein said intermediate group is a methylene group.

8. A photosensitive recording material as claimed in claim 2, wherein said inorganic pigment has a particle size between about 3 and 10 μm.

9. A photosensitive recording material as claimed in claim 8, wherein said inorganic pigment comprises silica.

10. A photosensitive recording material as claimed in claim 9, wherein said silica has an average particle diameter of 8 μm.

* * * * *

UNITED STATES PATENT AND TRADEMARK OFFICE
CERTIFICATE OF CORRECTION

PATENT NO. : 4,687,726
DATED : August 18, 1987
INVENTOR(S) : Gunter Schloegl, et. al.

It is certified that error appears in the above-indentified patent and that said Letters Patent is hereby corrected as shown below:

On the Title page, item [75], inventor's last name should be spelled as --Schloegl--.

Signed and Sealed this

Twenty-first Day of June, 1994

*Attest:*

BRUCE LEHMAN

*Attesting Officer*            *Commissioner of Patents and Trademarks*